(12) United States Patent
Miura et al.

(10) Patent No.: US 10,680,197 B2
(45) Date of Patent: Jun. 9, 2020

(54) DISPLAY DEVICE AND METHOD OF MANUFACTURING DISPLAY DEVICE

(71) Applicant: JOLED INC., Tokyo (JP)

(72) Inventors: Masanori Miura, Tokyo (JP); Atsuhito Murai, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 16/018,077

(22) Filed: Jun. 26, 2018

(65) Prior Publication Data
US 2019/0006617 A1    Jan. 3, 2019

(30) Foreign Application Priority Data

Jul. 3, 2017 (JP) ................. 2017-130437

(51) Int. Cl.
| | | |
|---|---|---|
| H01L 27/32 | (2006.01) |
| H01L 51/52 | (2006.01) |
| H01L 51/50 | (2006.01) |
| G09G 3/3258 | (2016.01) |
| G09G 3/3266 | (2016.01) |
| G09G 3/3233 | (2016.01) |
| H01L 51/56 | (2006.01) |

(52) U.S. Cl.
CPC ....... *H01L 51/5246* (2013.01); *G09G 3/3233* (2013.01); *G09G 3/3258* (2013.01); *G09G 3/3266* (2013.01); *H01L 27/322* (2013.01); *H01L 27/3246* (2013.01); *H01L 27/3258* (2013.01); *H01L 27/3262* (2013.01); *H01L 27/3265* (2013.01); *H01L 51/5036* (2013.01); *H01L 51/5056* (2013.01); *H01L 51/5072* (2013.01); *H01L 51/5092* (2013.01); *H01L 51/5218* (2013.01); *H01L 51/5234* (2013.01); *H01L 51/56* (2013.01); *G09G 2300/0842* (2013.01); *H01L 51/5237* (2013.01)

(58) Field of Classification Search
CPC . H01L 27/32; H01L 27/3258; H01L 27/3276; H01L 27/3248
See application file for complete search history.

(56) References Cited

U.S. PATENT DOCUMENTS

| | | | | |
|---|---|---|---|---|
| 2011/0163331 A1* | 7/2011 | Yamazaki | ........... | H01L 27/3246 257/88 |
| 2015/0008406 A1 | 1/2015 | Furuie | | |
| 2019/0242011 A1* | 8/2019 | Gertmann | ............. | C23C 14/547 |

FOREIGN PATENT DOCUMENTS

| | | |
|---|---|---|
| JP | 2009-295911 A | 12/2009 |
| JP | 2015-15089 A | 1/2015 |

* cited by examiner

*Primary Examiner* — Jae Lee
(74) *Attorney, Agent, or Firm* — Hauptman Ham, LLP

(57) ABSTRACT

A display device includes a display region, an organic insulating layer, a display element, and a moisture-ingress barrier. The organic insulating layer has a groove outside the display region. The organic insulating layer extends over the display region and a region outside the groove. The display element is disposed in the display region and includes, in order, a first electrode, an organic layer, and a second electrode. The organic layer includes one or more moisture-reacting layers. The moisture-ingress barrier is disposed in the groove of the organic insulating layer, includes a material identical to the material of the one or more moisture-reacting layers, and has a thickness greater than the thickness of the one or more moisture-reacting layers.

17 Claims, 12 Drawing Sheets

DISPLAY DEVICE AND METHOD OF MANUFACTURING DISPLAY DEVICE

CROSS REFERENCE TO RELATED APPLICATIONS

This application claims the benefit of Japanese Priority Patent Application No. 2017-130437 filed on Jul. 3, 2017, the entire contents of which are incorporated herein by reference.

BACKGROUND

The present technology relates to a display device including organic electroluminescent (EL) elements and a method of manufacturing the display device.

Organic EL elements each include, for example, an organic layer including a light-emitting layer between a first electrode and a second electrode. The organic layer is susceptible to degradation induced by moisture, causing a reduction in display quality, as described in Japanese Unexamined Patent Application Publication Nos. 2009-295911 and 2015-15089, for example.

SUMMARY

There is a demand for a display device that suppresses ingress of moisture into a display region including organic EL elements.

It is desired to provide a display device that makes it possible to suppress the moisture ingress into the display region and a method of manufacturing such a display device.

A display device according to one embodiment of the technology includes: a display region; an organic insulating layer that has a groove outside the display region and extends over the display region and a region outside the groove; a display element that is disposed in the display region and includes, in order, a first electrode, an organic layer, and a second electrode, the organic layer including one or more moisture-reacting layers; and a moisture-ingress barrier that is disposed in the groove of the organic insulating layer, includes a material identical to the material of the one or more moisture-reacting layers, and has a thickness greater than the thickness of the one or more moisture-reacting layers.

A method of manufacturing a display device according to one embodiment of the technology includes: forming an organic insulating layer that has a groove outside a display region and extends over the display region and a region outside the groove; forming a first electrode in the display region; forming an organic layer on the first electrode, and a moisture-ingress barrier in the groove of the organic insulating layer, the organic layer including one or more moisture-reacting layers, the moisture-ingress barrier including a material identical to the material of the one or more moisture-reacting layers and having a thickness greater than the thickness of the one or more moisture-reacting layers; and forming a second electrode on the organic layer to form a display element including the first electrode, the organic layer, and the second electrode.

BRIEF DESCRIPTION OF THE DRAWINGS

The accompanying drawings are included to provide a further understanding of the technology and are incorporated in and constitute a part of this specification. The drawings illustrate exemplary embodiments and, together with the specification, serve to explain the principles of the technology.

DETAILED DESCRIPTION

Some embodiments of the technology are described in detail below with reference to the accompanying drawings. Note that the description is given in the following order.

1. Embodiments (e.g., Display Device Including Moisture-ingress Barrier between Display Region and Peripheral Region)
2. Application Examples (e.g., Example Electronic Apparatuses)

EMBODIMENTS

[Configuration]

Figure 1:
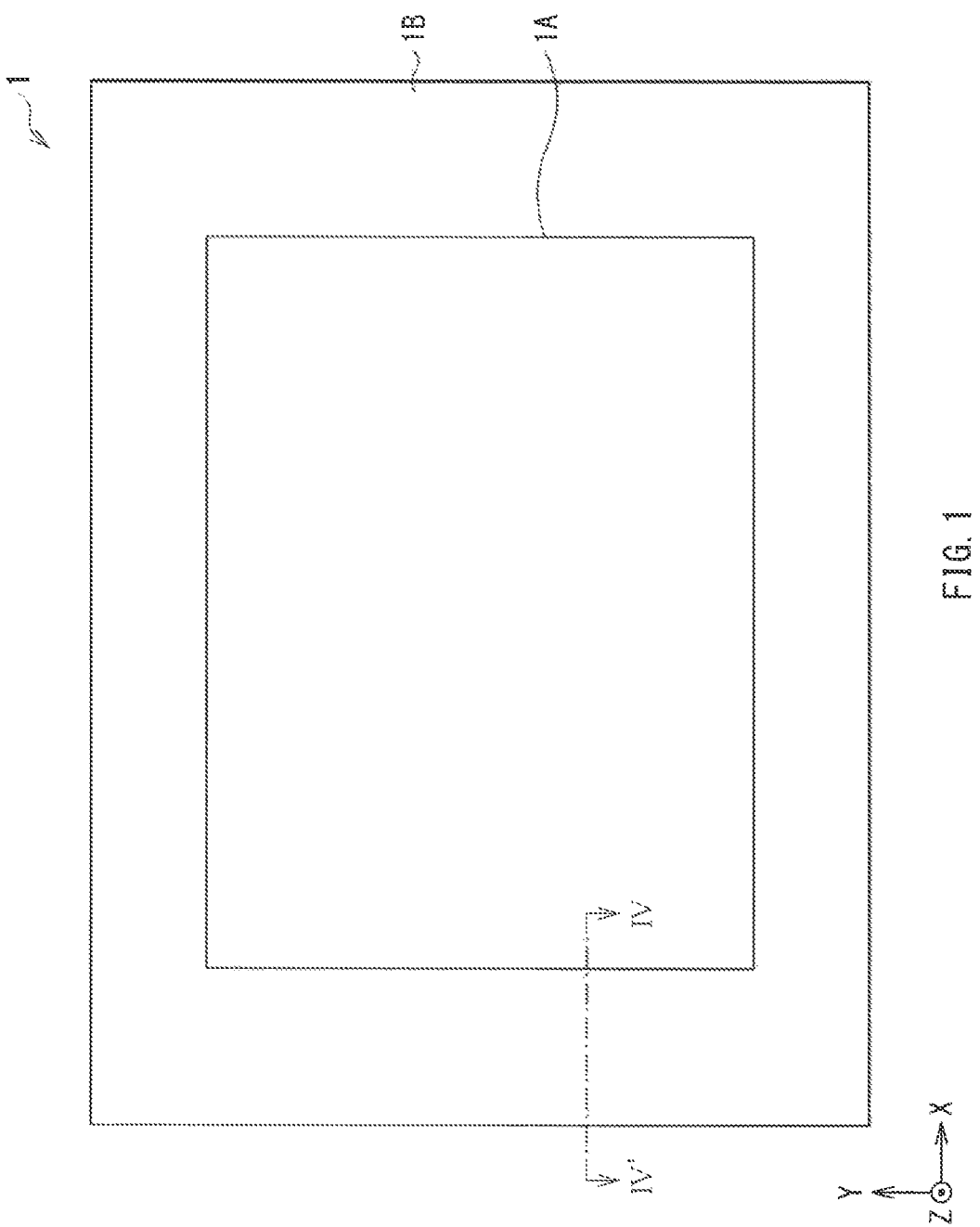
FIG. 1 is a schematic plan view of a display device according to one embodiment of the disclosure.

FIG. 1 schematically illustrates one entire configuration of a display device 1 according to one embodiment of the disclosure. The display device 1 may be, for example, an organic EL display including organic EL elements. The display device 1 may be of a top-emission type that emits red, green, or blue light through a top surface. The display device 1 may have a central display region 1A and a peripheral region 1B outside the display region 1A. The display region 1A may have a square shape, for example. The peripheral region 1B may have a bezel shape surrounding the display region 1A.

Figure 2:
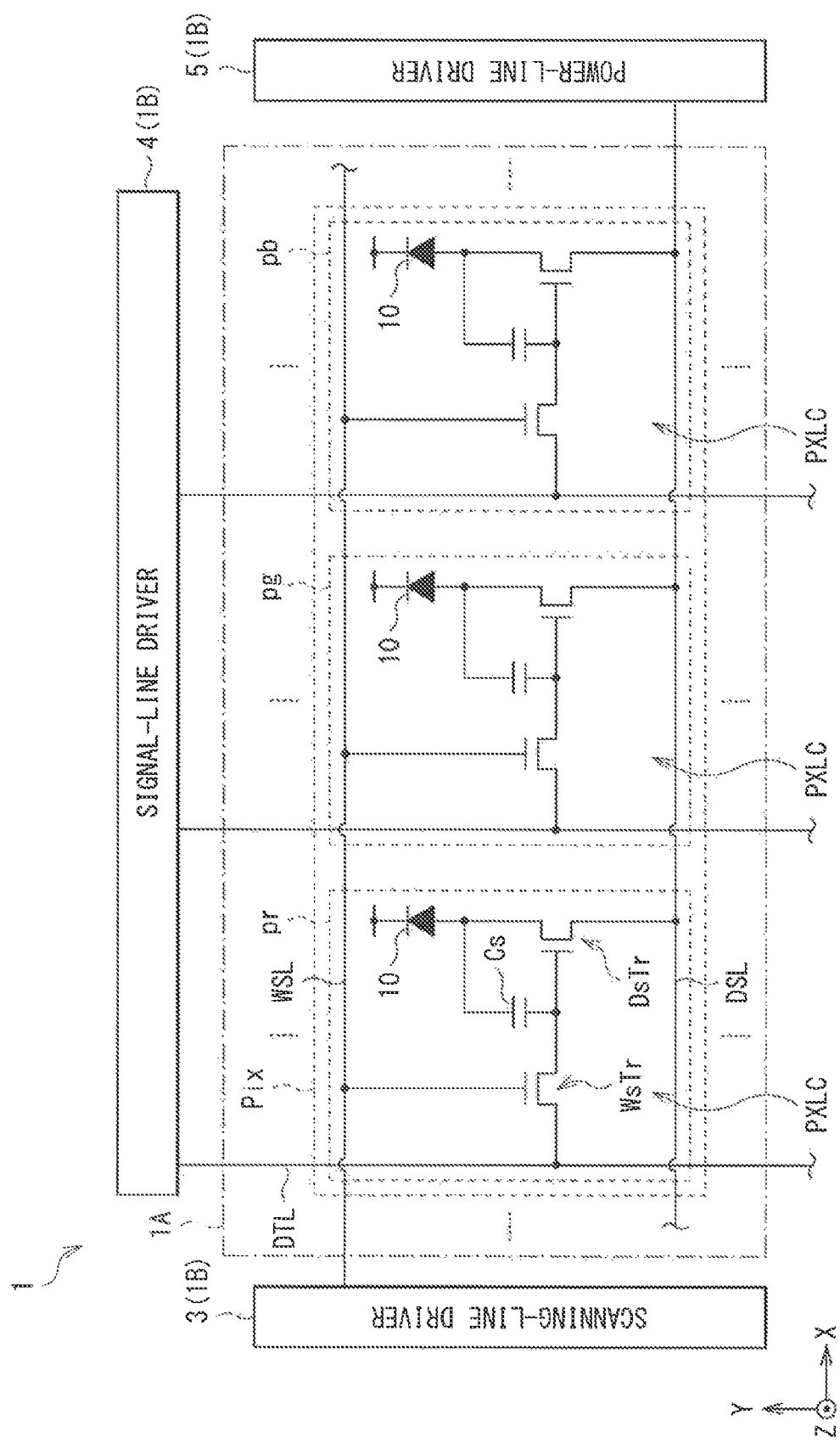
FIG. 2 is a block diagram illustrating one entire configuration of the display device illustrated in FIG. 1.

FIG. 2 illustrates an exemplary functional configuration in the display region 1A and the peripheral region 1B. The display region 1A may include multiple two-dimensional arrays of pixels pr, pg, and pb. An image may be displayed on the display region 1A by an active-matrix scheme on the basis of an external image signal, for example. Circuitry that drives the display region 1A may be disposed in the peripheral region 1B, for example. The circuitry may include a scanning-line driver 3, a signal-line driver 4, and a power-line driver 5. Across the display region 1A and the peripheral region 1B, multiple scanning lines WSL may extend along the pixel arrays in a row direction, multiple signal lines DTL may extend along the pixel arrays in a column direction, and multiple signal lines DSL may extend along the pixel arrays in the row direction, for example. The pixels pr, pg, and pb may be electrically coupled to the scanning-line driver 3 with the respective scanning lines WSL, to the signal-line driver 4 with the respective signal lines DTL, and to a power-line driver 5 with the respective power lines DSL. In an exemplary embodiment, the pixels pr, pg, and pb may correspond to sub-pixels, and the combination of the sub-pixels pr, pg, and pb may constitute a single pixel Pix.

Figure 3:
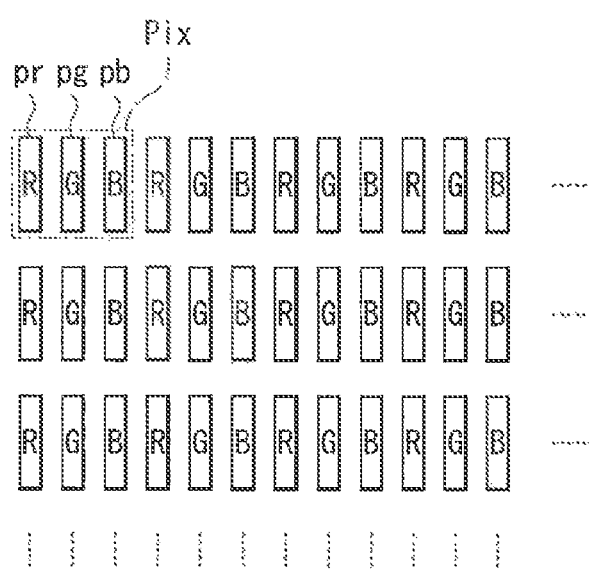
FIG. 3 schematically illustrates an exemplary arrangement of pixels illustrated in FIG. 2.

FIG. 3 is a plan view of an exemplary arrangement of the pixels Pix, illustrated in FIG. 2, each including the pixels pr, pg, and pb. The pixels pr, pg, and pb may each have, for example, a rectangular shape in plan view, and may be in a stripe pattern, viewed as a whole. The pixels aligned in a direction along long sides of the rectangular pixels pr, pg, or pb (i.e., the column direction in FIG. 3) may emit light in the same color. The pixels pr may emit red light, the pixels pg may emit green light, and the pixels pb may emit blue light, for example. These pixels pr, pg, and pb may each include a pixel circuit PXLC including an organic EL element 10, as illustrated in FIG. 2, for example.

The pixels pr, pg, and pb are hereinafter collectively referred to as pixels P in cases where no distinction is needed among the pixels pr, pg, and pb.

The pixel circuit PXLC may control light emission and light extinction of the corresponding pixel pr, pg, or pb. The pixel circuit PXLC may include, for example, the organic EL element 10, a storage capacitor Cs, a switching transistor WsTr, and a driving transistor DsTr. In one embodiment, the organic EL element 10 corresponds to a specific but non-limiting example of a "display element". Note that the pixel circuit PXLC may have, for example but not limited to, a 2Tr1C circuit configuration in any embodiment of the technology. Alternatively, the pixel circuit PXLC may have a configuration including various capacitors and transistors in addition to the 2Tr1C configuration.

The switching transistor WsTr may control application of an image signal (signal voltage) to a gate of the driving transistor DsTr. In detail, the switching transistor WsTr may sample a signal voltage of the corresponding signal line DTL on the basis of a voltage applied to the corresponding scanning line WSL and write the sampled signal voltage to the gate of the driving transistor DsTr. The driving transistor DsTr may be coupled in series to the organic EL element 10. The driving transistor DsTr may regulate an electric current flowing through the organic EL element 10 on the basis of the magnitude of the signal voltage sampled at the switching transistor WsTr. The driving transistor DsTr and the switching transistor WsTr may be, for example, thin-film transistors (TFTs) of an n-channel MOS type or a p-channel MOS type. The driving transistor DsTr and the switching transistor WsTr may be of a single-gate type or a dual-gate type. The storage capacitor Cs may hold a predetermined voltage between the gate and a source of the driving transistor DsTr.

The gate of the switching transistor WsTr may be coupled to the corresponding scanning line WSL. One of a source or a drain of the switching transistor WsTr may be coupled to the corresponding signal line DTL, the other of the source or the drain of the switching transistor WsTr may be coupled to the gate of the driving transistor DsTr. One of the source or a drain of the driving transistor DsTr may be coupled to the corresponding power line DSL, the other of the source or the drain of the driving transistor DsTr may be coupled to an anode of the organic EL element 10. The anode of the organic EL element 10 corresponds to a first electrode 15 described below. The storage capacitor Cs may be disposed between the gate of the driving transistor DsTr and the anode of the organic EL element 10.

The scanning lines WSL may supply a selection pulse to the respective pixels P to select the pixels P in the display region 1A on a row basis. The scanning lines WSL may be coupled to a non-illustrated output end of the scanning-line driver 3 and the gate of the switching transistor WsTr described below. The signal lines DTL may supply a signal pulse to the respective pixels P. The signal pulse may have a signal potential Vsig and a reference potential Vofs in accordance with the image signal. The signal lines DTL may be coupled to a non-illustrated output end of the signal-line driver 4 and the source or the drain of the switching transistor WsTr. The power lines DSL may supply a fixed potential Vcc as electric power to the respective pixels P. The power lines DSL may be coupled to a non-illustrated output end of the power-line driver 5 and the source or the drain of the driving transistor DsTr described below. Note that a cathode of the organic EL element 10 may be coupled to a common potential line (cathode line). The cathode of the organic EL element 10 corresponds to a second electrode 18 described below.

The scanning-line driver 3 may output a predetermined selection pulse to the scanning lines WSL in a line sequential manner to cause the pixels P to perform various operations, such as anode resetting, threshold voltage (Vth) compensation, writing of the signal voltage Vsig, mobility compensation, and light emission, at a predetermined timing. The signal-line driver 4 may generate an analog image signal based on an external digital image signal and transmit the analog image signal to the signal lines DTL. The power-line driver 5 may output a constant potential to the power lines DSL. The scanning-line driver 3, the signal-line driver 4, and the power-line driver 5 may operate in conjunction with one another in response to a timing signal from a non-illustrated timing controller. The external digital image signal may be corrected at a non-illustrated image signal receiver and thereafter transferred to the signal-line driver 4.

An exemplary configuration of the display device 1 is described in detail below.

Figure 4:
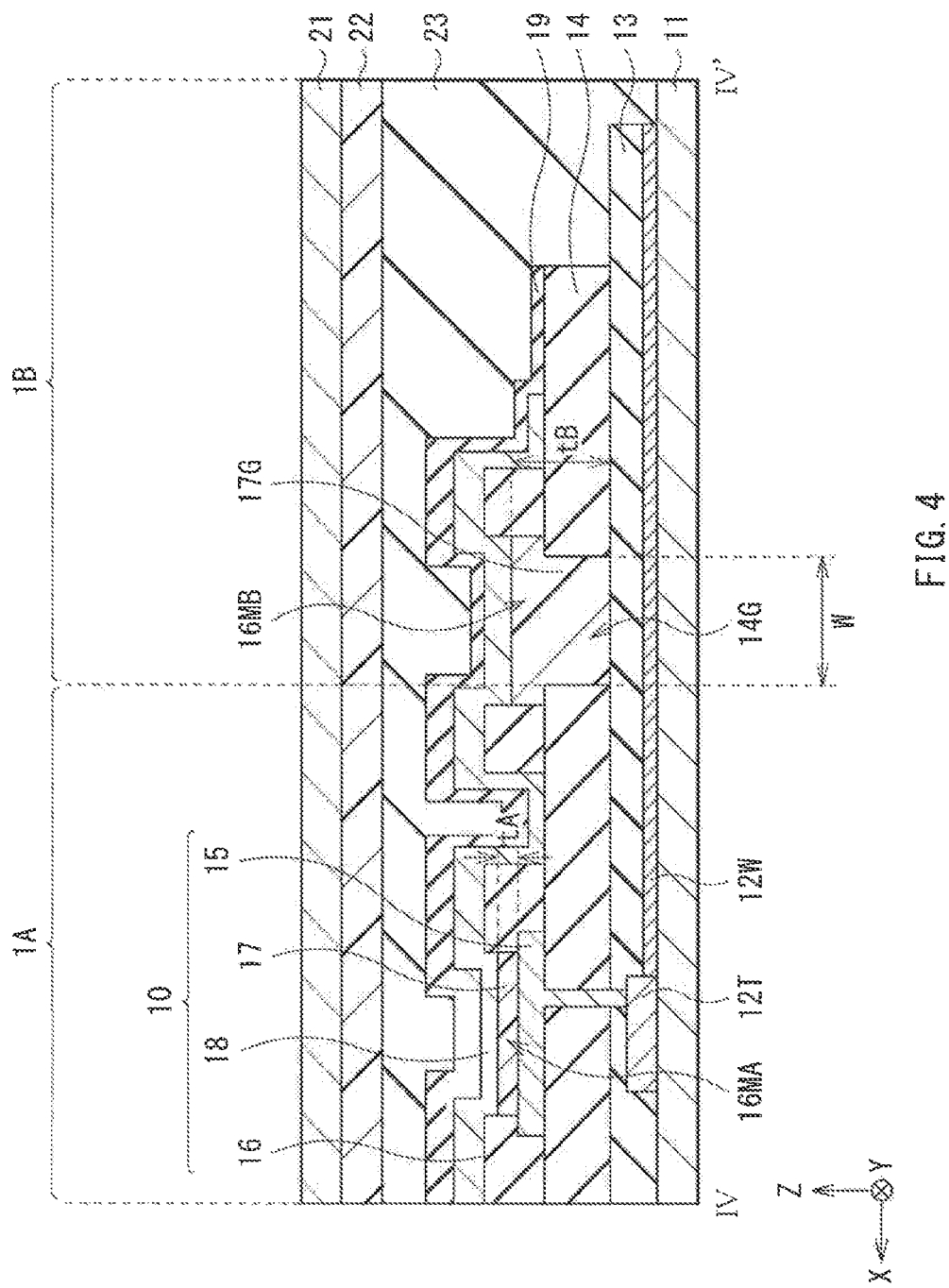
FIG. 4 is a schematic cross-sectional view of the display device taken along the line IV-IV' of FIG. 1.

FIG. 4 is a schematic cross-sectional view of the display device 1 in the display region 1A and the peripheral region 1B, taken along the line IV-IV' of FIG. 1. The display device 1 includes multiple organic EL element 10 sealed between opposite substrates, i.e., first and second substrates. In detail, thin film transistors (TFTs) 12T and wiring lines 12W coupled to the respective TFTs 12T may be disposed on the first substrate 11. The TFTs 12T and the wiring lines 12W are covered with an inorganic insulating layer 13 and an organic insulating layer 14 in this order. The organic EL elements 10 are disposed on the organic insulating layer 14. Each of the organic EL elements 10 includes a first electrode 15, an organic layer 17, and a second electrode 18, in this order from the organic insulating layer 14. Each adjacent ones of the organic EL elements 10 may be separated by an element isolation film 16. The organic EL elements 10 may be covered with a protection layer 19, for example. The protection layer 19 and the second substrate 21 may be held together with a sealing layer 23 disposed between the protection layer 19 and the second substrate 21. A color filter layer 22 may be disposed on one surface, facing the first substrate 11, of the second substrate 21, for example.

The first substrate 11 may include, for example, glass, quartz, silicon, or a resin material, or may be a metal plate.

Non-limiting example of the resin material may include polyethylene terephthalate (PET), polyimide (PI), polycarbonate (PC), and polyethylene naphthalate (PEN).

The TFTs 12T may correspond to the driving transistors DsTr illustrated in FIG. 2, for example. The TFTs 12T may be disposed in the display region 1A. In one embodiment, each of the TFTs 12T may be disposed in a selective region on the first substrate 11 and include, in order, a semiconductor layer, a gate insulating film, and a gate. The semiconductor layer may include, for example, an oxide semiconductor material. An interlayer insulating film may cover the gate, the gate insulating film, and the semiconductor layer. The TFT 12T may include a pair of a source and a drain on the interlayer insulating film. The source and the drain may be electrically coupled to the semiconductor layer through contact holes in the interlayer insulating film. One of the source or the drain may be electrically coupled to the first electrode 15 through a contact hole in the inorganic insulating layer 13 and the organic insulating layer 14. In an exemplary embodiment of the technology, the TFTs 12T may have, but not limited to, a top-gate structure. In an alternative embodiment, the TFTs 12 may have a bottom-gate structure. The semiconductor layer may be a silicon-based semiconductor layer including amorphous silicon, polycrystalline silicon (also called polysilicon), or microcrystalline silicon.

The wiring lines 12W may correspond to the power lines DSL illustrated in FIG. 2, for example. Each of the wiring lines 12W may be electrically coupled to one of the source or the drain, uncoupled to the first electrode 15, of the corresponding TFT 12T. The wiring lines 12W may extend across the display region 1A and the peripheral region 1B in a predetermined direction, for example, along the X-axis of FIG. 4. In an exemplary embodiment, the wiring lines 12W may include a metal such as molybdenum (Mo), tungsten (W), aluminum (Al), copper (Cu), silver (Ag), or titanium (Ti). In an alternative embodiment, the wiring lines 12W may include a metal alloy. In still another embodiment, each of the wiring lines 12W may be a laminate film including a plurality of metal films.

An under coating (UC) film may be disposed between the first substrate 11 and the semiconductor layers of the TFTs 12T or between the first substrate 11 and the wiring lines 12W. The UC film suppresses or prevents migration of substances such as sodium ions from the first substrate 11 to an upper layer. The UC film may include an insulating material such as silicon nitride (SiN) or silicon oxide ($SiO_2$).

The inorganic insulating layer 13 may be provided in the display region 1A and the peripheral region 1B and cover the TFTs 12T and the wiring lines 12W. The inorganic insulating layer 13 may be a silicon oxide ($SiO_2$) film having a thickness of 200 nm, for example. Alternatively, the inorganic insulating layer 13 may be a silicon nitride (SiN) film or a silicon oxide nitride (SiON) film, or a laminate thereof.

The organic insulating layer 14 covers the TFTs 12T and the wiring lines 12W with the inorganic insulating layer 13 disposed between the organic insulating layer 14 and the TFTs 12T and between the organic insulating layer 14 and the wiring lines 12W may serve as a planarizing layer. The organic insulating layer 14 extends over the display region 1A and the peripheral region 1B. The organic insulating layer 14 has a groove 14G in a region adjacent to the periphery of the display region 1A and within the peripheral region 1B. The groove 14G may have a width W along the X-axis of FIG. 4, for example. In other words, the organic insulating layer 14 may extend over the display region 1A and the peripheral region 1B outside the groove 14G. In an exemplary embodiment, the groove 14G may extend completely through the organic insulating layer 14, and the inorganic insulating layer 13 may exposed in the groove 14G of the organic insulating layer 14. In an alternative embodiment, part of the organic insulating layer 14 may remain on the bottom of the groove 14G. The example effects of the technology may still be available even in a case where a small part of the organic insulating layer 14 remains on the bottom of the groove 14G.

Figure 5:
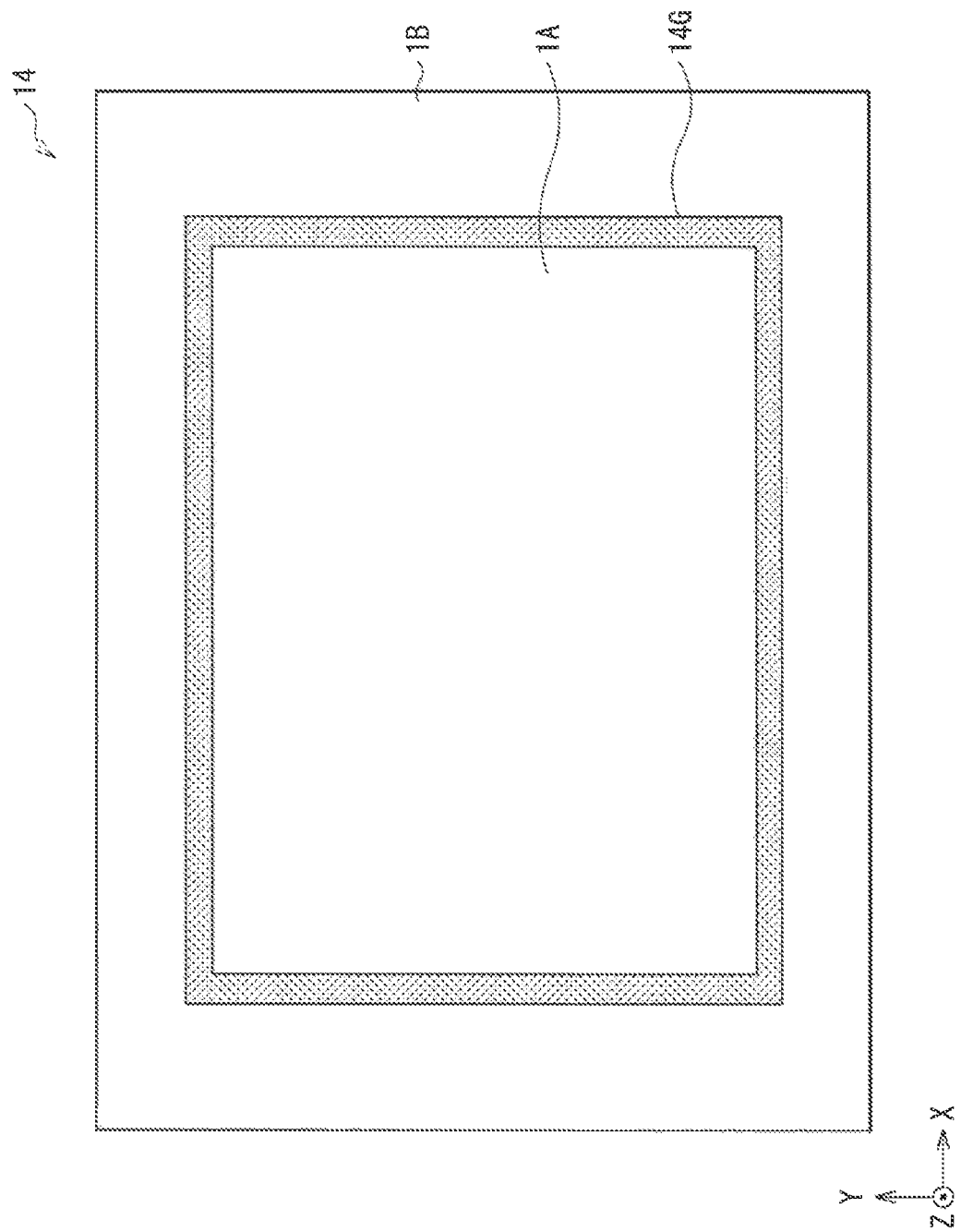
FIG. 5 is a schematic plan view of an exemplary organic insulating layer illustrated in FIG. 4.

FIG. 5 is a schematic plan view of the groove 14G. The groove 14G in the peripheral region 1B may surround the display region 1A along the periphery of the display region 1A. The groove 14G may have a rectangular shape in plan view, for example. Providing the groove 14G of the organic insulating layer 14 with high moisture permeability makes it possible to suppress ingress of moisture from the peripheral region 1B outside the groove 14G into the display region 1A. As described below, a moisture-ingress barrier 17G is provided in the groove 14G of the organic insulating layer 14 of the display device 1 may enhance efficiency in suppressing the moisture ingress from the peripheral region 1B.

With reference to FIG. 4, an end portion of the organic insulating layer 14 may be disposed more adjacent to the display region 1A than an end portion of the inorganic insulating layer 13. In the peripheral region 1B, the end portion of the inorganic insulating layer 13 may be exposed without the organic insulating layer 14 disposed thereon. The organic insulating layer 14 may be a polyimide resin film having a thickness of 3000 nm, for example. Alternatively, the organic insulating layer 14 may be an epoxy resin film, a novolac resin film, or an acrylic resin film.

The organic EL elements 10 for the respective pixels pr, pg, and pb are disposed on the organic insulating layer 14 and within the display region 1A. The multiple first electrodes 15 of the organic EL elements 10 may be disposed separately from one another on the organic insulating layer 14.

Each of the first electrodes 15 in the corresponding pixel P may be a reflective electrode functioning as an anode. Non-limiting examples of the material of the first electrode 15 may include metal elementary substances, such as aluminum (Al), chromium (Cr), gold (Au), platinum (Pt), nickel (Ni), copper (Cu), tungsten (W), or silver (Ag), and a metal alloy thereof. Alternatively, the first electrodes 15 may include a laminate of a metal film including any of these metal elementary substances or metal alloys and a transparent electrically-conductive film including an electrically-conductive material with optical transparency. Non-limiting examples of the transparent electrically-conductive material may include an indium tin oxide (ITO) material, an indium zinc oxide (IZO) material, and a zinc oxide (ZnO) material. Non-limiting examples of the ZnO material may include aluminum (Al)-doped zinc oxide (AZO) and gallium (Ga)-doped zinc oxide (GZO).

The element isolation film 16 may extend over surfaces of the first electrodes 15 and gaps between each adjacent ones of the first electrodes 15 so as to cover the multiple first electrodes 15. The element isolation film 16 may have first apertures 16MA facing the respective first electrodes 15. Each of the first electrodes 15 may be exposed in the corresponding first aperture 16MA of the element isolation film 16. The organic layers 17 may be disposed on the respective exposed first electrodes 15. The first apertures 16MA may each have a width equal to the width W of the groove 14G of the organic insulating layer 14, for example. The element isolation film 16 may define light-emitting regions of the respective pixels P and insulate the first electrodes 15 from the second electrode 18. The element isolation film 16 may serve as partitions during a wet process for forming the organic layers 17.

The element isolation film 16 may be provided on the peripheral region 1B, for example. The element isolation film 16 may have a second aperture 16MB exposing the groove 14G of the organic insulating layer 14. The second aperture 16MB may overlap with the groove 14G in plan view of the X-Y plane of FIG. 4, for example. The second aperture 16MB may have a width greater than the width W of the groove 14G. As described below, the moisture-ingress barrier 17G is disposed in the second aperture 16MB of the element isolation film 16 and the groove 14G of the organic insulating layer 14. In one embodiment where the element isolation film 16 may serve as the partitions, the element isolation film 16 may include a photosensitive polymer such as an acrylic resin, a polyimide resin, a fluorine resin, a silicon-based resin, a fluorinated polymer, a silicon-based polymer, a novolac resin, an epoxy resin, or a norbornene resin. In an alternative embodiment, the element isolation film 16 may include any of these resin materials and a pigment dispersed in the resin material. In still another embodiment, the element isolation film 16 may include an inorganic material such as silicon oxide, silicon nitride, or silicon oxide nitride.

Figure 6:
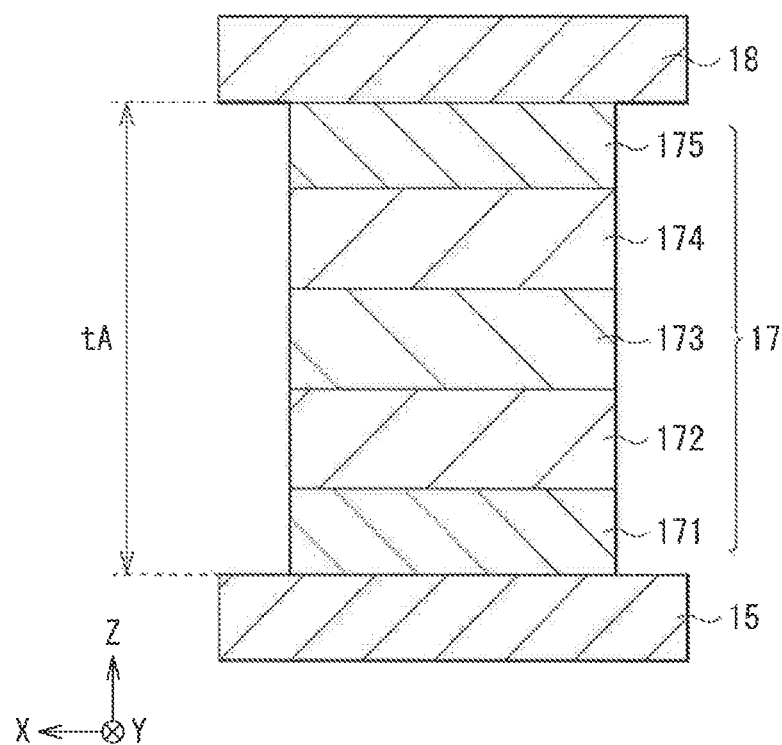
FIG. 6 is a schematic cross-sectional view of an exemplary organic layer illustrated in FIG. 3.

FIG. 6 illustrates an exemplary configuration of each organic layer 17 according to one embodiment of the technology. The organic layer 17 may include, for example, a hole injection layer 171, a hole transport layer 172, a light-emitting layer 173, an electron transport layer 174, and an electron injection layer 175, in this order from the first electrode 15. The organic layer 17 may be formed by, for example, coating, which is described below. The organic layer 17 of each pixel pr, pg, or pb may be disposed in the corresponding first aperture 16MA of the element isolation film 16. The organic layer 17 disposed in the first aperture 16MA may have a thickness to in a range from 100 nm to 200 nm, along the Z-axis of FIGS. 4 and 6, for example. The light-emitting layers 173 of the pixels pr, pg, pb may emit light in different colors from one another, for example. In an exemplary embodiment, the light-emitting layers 173 of the pixel pr may emit red light, the light-emitting layers 173 of the pixel pg may emit green light, and the light-emitting layers 173 of the pixel pb may emit blue light.

The hole injection layer 171 suppresses or prevents leakage. The hole injection layer 171 may include hexaazatriphenylene (HAT), for example. The hole injection layer 171 may have a thickness in a range from 1 nm to 20 nm, for example. The hole transport layer 172 may include α-NPD [N,N'-di(1-naphthyl)-N,N'-diphenyl-[1,1'-biphenyl]-4,4'-diamine], for example. The hole transport layer 172 may have a thickness in a range from 15 nm to 100 nm, for example.

The light-emitting layer 173 may emit light in a predetermined color through combination of holes and electrons. The light-emitting layer 173 may have a thickness in a range from 5 nm to 50 nm, for example. The light-emitting layer 173 that emits light in a red wavelength range may include rubrene doped with a pyrromethene boron complex, for example. The rubrene may be served as a host material. The light-emitting layer 173 that emits light in a green wavelength range may include tris(8-hydroxyquinolinato)aluminium (Alq3), for example. The light-emitting layer 173 that emits light in a blue wavelength range may include ADN (9,10-di(2-naphthyl)anthracene) doped with a diamino-chrysene derivative, for example. The AND may serves as a host material and the diamino-chrysene derivative may serves as a dopant material. The AND may be deposited into a thickness of 20 nm, for example, on the hole transport layer 172. The doping rate of the diamino-chrysene derivative relative to the thickness of the ADN layer may be 5%.

The electron transport layer 174 may include BCP (2,9-dimethyl-4,7-diphenyl-1,10-phenanthroline). The electron transport layer 174 may have a thickness in a range from 15 nm to 200 nm, for example. The electron injection layer 175 may include lithium fluoride lithium (LiF), for example. The electron injection layer 175 may have a thickness in a range from 15 nm to 270 nm, for example. Alternatively, the electron injection layer 175 may include zinc oxide (ZnO) or a zinc oxide-based material, for example. The zinc oxide-based material may be a mixture of zinc oxide and an alkali metal compound, for example. The electron injection layer 175 including zinc oxide may be readily formed by coating. Reference is made to International Patent No. WO 2013/122182, for example.

One or more layers in the organic layer 17 may denature in response to moisture and thereby deactivate the moisture. In detail, the organic layer 17 may include one or more moisture-reacting layers. In one embodiment, one or more layers in the organic layer 17 may be the moisture-reacting layers. For example, the light-emitting layer 173 or the electron injection layer 175 may be the moisture-reacting layer. In another embodiment, all the layers in the organic layer 17 may be the moisture-reacting layers. For example, the hole injection layer 171, the hole transport layer 172, the light-emitting layer 173, the electron transport layer 174, and the electron injection layer 175 may be the moisture-reacting layers.

The moisture-ingress barrier 17G is disposed in the second aperture 16MB of the element isolation film 16 and the groove 14G of the organic insulating layer 14. As illustrated in FIG. 5, the moisture-ingress barrier 17G may be similar in shape to the groove 14G in plan view and surround the display region 1A. In one embodiment of the technology, the moisture-ingress barrier 17G may include a material identical to the material of the organic layer 17, for example. The moisture-ingress barrier 17G may have a thickness tB greater than the thickness tA of the organic layer 17 along the Z-axis of FIG. 4, for example. The width W of the groove 14G receiving the moisture-ingress barrier 17G therein may be equal to the width of the first aperture 16MA of the element isolation film 16 and receiving the organic layer 17 therein. The thickness tB of the moisture-ingress barrier 17G may be, for example, 1.5 to 2 times the thickness tA of the organic layer 17 and may be in a range from 150 nm to 400 nm. Although described in detail below, this makes it possible to effectively suppress the moisture ingress from the peripheral region 1B into the display region 1A. The moisture-ingress barrier 17G may include, for example, all the materials of the layers in the organic layer 17. The thickness tB of the moisture-ingress barrier 17G may be greater than the thickness tA or the total thickness of the hole injection layer 171, the hole transport layer 172, the light-emitting layer 173, the electron transport layer 174, and the electron injection layer 175.

The moisture-ingress barrier 17G may be formed by, for example, coating, as in the case of the organic layers 17. Forming the moisture-ingress barrier 17G by coating such as ink-jetting helps to stabilize the amount of ink to be discharged to form the organic layers 17, which is described in detail below. Accordingly, forming the moisture-ingress barrier 17G including all the materials of the layers in each organic layer 17 helps to stabilize the thicknesses of the layers in each organic layer 17.

The moisture-ingress barrier 17G may include at least a coating film including a material identical to the material of the moisture-reacting layer(s) in each organic layer 17 and having a thickness greater than that of the moisture-reacting layer(s) in the organic layer 17. In an exemplary embodiment where the light-emitting layer 173 is the moisture-reacting layer, the moisture-ingress barrier 17G may include at least a coating film including a material identical to the material of the light-emitting layer 173 and having a thickness greater than that of the light-emitting layer 173.

In an exemplary embodiment, the moisture-ingress barrier 17G may be disposed separately from the organic layers 17. The moisture-ingress barrier 17G may have a bottom surface (i.e., a surface adjacent to the first substrate 11) in contact with the inorganic insulating layer 13. The moisture-ingress barrier 17G may face the wiring lines 12W with the inorganic insulating layer 13 disposed between the moisture-ingress barrier 17G and the wiring lines 12W. The moisture-ingress barrier 17G may have an upper surface (i.e., a surface adjacent to the second substrate 21) in contact with the second electrode 18 extending from the display region 1A. In detail, the wiring lines 12W and the second electrode 18 having potentials different from each other may face each other with the inorganic insulating layer 13 and the moisture-ingress barrier 17G disposed between the wiring lines 12W and the second electrode 18. The moisture-ingress barrier 17G including the coating film may have a high coatability. Such a moisture-ingress barrier 17G suppresses a short circuit between the wiring lines 12W and the second electrode 18 even in a case where the inorganic insulating layer 13 is too thin to sufficiently cover the wiring lines 12W.

The second electrode 18 may serve as a cathode, for example. The second electrode 18 may extend over the entire display region 1A to serve as a common electrode for all the pixels P. The second electrode 18 may be a transparent electric ally-conductive film, for example. The transparent electrically-conductive film may include an indium tin oxide (ITO)-based material, an indium zinc oxide (IZO)-based material, or a zinc oxide (ZnO)-based material. Non-limiting example of the zinc oxide-based material may include aluminum (Al)-doped zinc oxide (AZO) and gallium (Ga)-doped zinc oxide (GZO). The second electrode 18 may have any thickness, which may be determined in view of electrical conductivity and optical transparency, in one embodiment. Alternatively, the second electrode 18 may include an alloy of magnesium and silver (Mg—Ag alloy).

The protection layer 19 may cover the second electrode 18. The protection layer 19 may include silicon nitride, for example. The protection layer 19 may serve as a protection film to suppress the ingress of moisture into the organic EL elements 10 and degradation in light emission efficiency and other characteristics of the organic EL elements 10.

The sealing layer 23 may hold the protection layer 19 and the second substrate 21 together and seal the organic EL elements 10. Non-limiting examples of the material of the sealing layer 23 may include an acrylic resin, a polyimide resin, a fluorine resin, a silicon-based resin, a fluorinated polymer, a silicon-based polymer, a novolac resin, an epoxy resin, and a norbornene resin. In an alternative embodiment, the sealing layer 23 may include any of these resin materials and a pigment dispersed in the resin material.

The color filter layer 22 may include a red filter, a green filter, and a blue filter, for example. The color filter layer 22 may be disposed on one surface, adjacent to the sealing layer 23, of the second substrate 21, for example. The red filter may face a pixel region including the organic EL elements 10 of the pixels pr, the green filter may face a pixel region including the organic EL elements 10 of the pixels pg, and the blue filter may face a pixel region including the organic EL elements 10 of the pixels pb. These red, green, blue filters may each include a resin containing a pigment.

Optionally, black matrix layers may be disposed in the gaps between the red, green, and blue filters (i.e., the gaps between the pixel regions). The black matrix layers may each be a resin film containing a black colorant, or an optical interference thin-film filter, for example. The thin-film filter may include one or more films including, for example, metal, metal nitride, or metal oxide. The thin-film filter may attenuate light through optical interference of the films. Non-limiting examples of the thin-film filter may include an alternate laminate of a chromium (Cr) film and an oxide chromium (III) ($Cr_2O_3$) film.

The second substrate 21 and the sealing layer 23 may seal the organic EL elements 10. The second substrate 21 may include, for example, a glass or plastic material that is transparent to light emitted from the organic EL elements 10.

[Manufacturing Method]

A method of manufacturing the display device 1 is described below with reference to FIGS. 7A to 8B, for example.

The manufacture of the display device 1 may start with forming the TFTs 12T and the wiring lines 12W on the first substrate 11. A silicon oxide film may be deposited by chemical vapor deposition (CVD) to cover the TFTs 12T and the wiring lines 12W. The inorganic insulating layer 13 may be thereby formed.

Figure 7A:
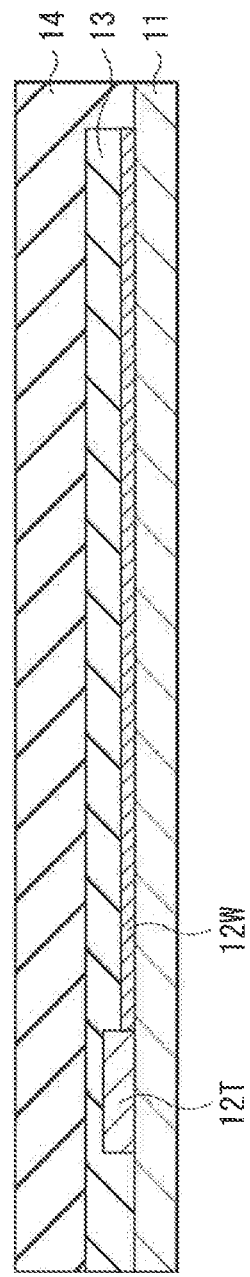
FIG. 7A is a schematic cross-sectional view of the display device illustrated in FIG. 4 for illustrating a process in a method of manufacturing the display device.
Figure 7B:
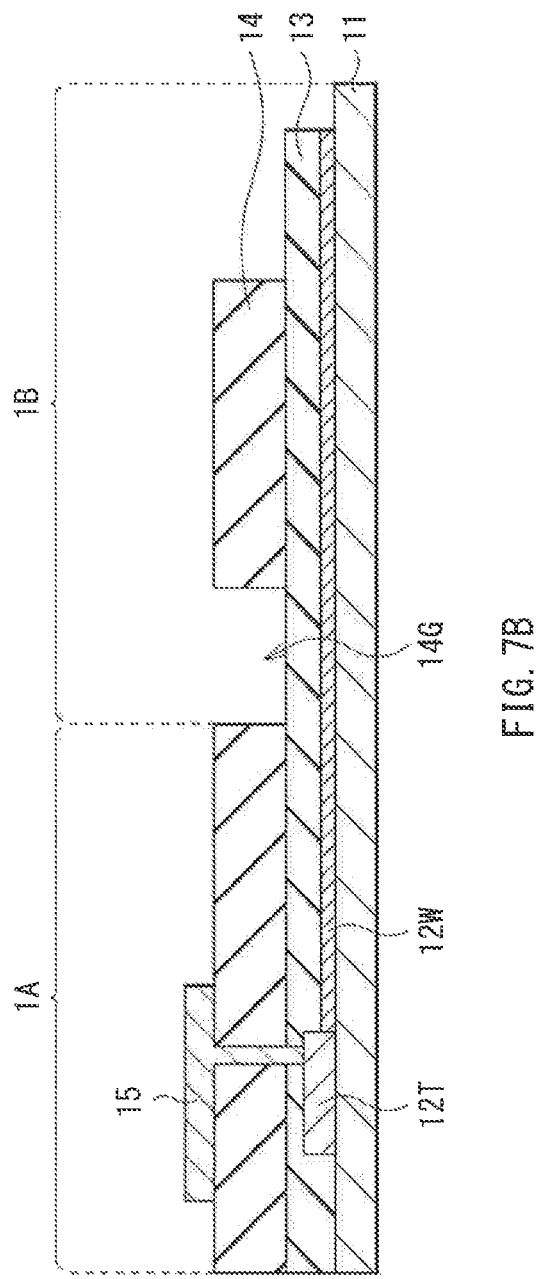
FIG. 7B is a schematic cross-sectional view of the display device for illustrating a process following the process illustrated in FIG. 7A.

Thereafter, as illustrated in FIG. 7A, the organic insulating layer 14 including a photosensitive material is formed, for example, by spin coating or slit coating. The organic insulating layer 14 may be thereafter subjected to exposing, developing, and firing processes for forming the groove 14G and the contact holes in the organic insulating layer 14. The contact holes may each extend to the source and drain of the TFT 12T. Thereafter, as illustrated in FIG. 7B, the first electrodes 15 are formed on the organic insulating layer 14. In an exemplary embodiment, an electrically-conductive film may be formed by sputtering to fill the contact holes in the organic insulating layer 14, and the electrically-conductive film may be thereafter patterned into the first electrodes 15 by photolithography or etching.

Figure 8A:
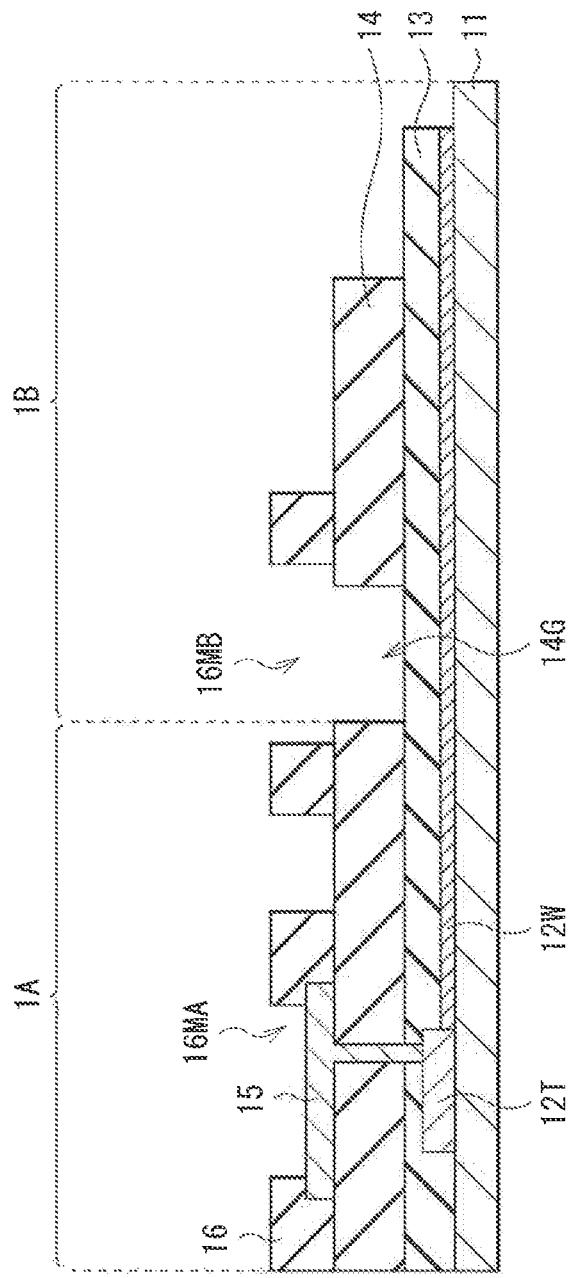
FIG. 8A is a schematic cross-sectional view of the display device for illustrating a process following the process illustrated in FIG. 7B.
Figure 8B:
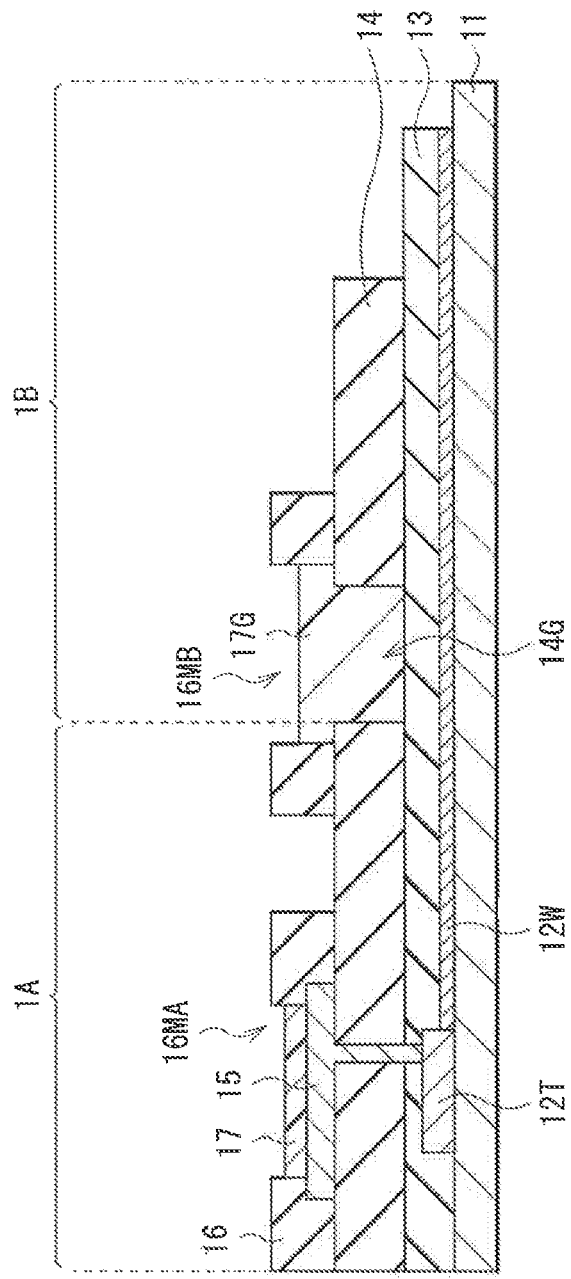
FIG. 8B is a schematic cross-sectional view of the display device for illustrating a process following the process illustrated in FIG. 8A.

After the formation of the first electrodes 15, the element isolation film 16 may be formed on the first electrodes 15, as illustrated in FIG. 8A. The element isolation film 16 may have the first apertures 16MA on the respective first electrodes 15 and the second aperture 16MB on the groove 14G. Thereafter, as illustrated in FIG. 8B, the organic layers 17 may be formed in the respective first apertures 16MA of the element isolation film 16. In the same process for forming the organic layers 17, the moisture-ingress barrier 17G may be formed in the second aperture 16MB of the element isolation film 16 and the groove 14G of the organic insulating layer 14. In an exemplary embodiment, any material of the organic layer 17 may be applied by coating such as ink-jetting, to form the organic layers 17 in the first apertures 16MA, and the moisture-ingress barrier 17G in the second aperture 16MB (i.e., the groove 14G). The moisture-ingress barrier 17G is formed into a thickness tB greater than the thickness to of each organic layer 17. In one embodiment of the technology, the organic layers 17 and the moisture-ingress barrier 17G may be formed by coating. This facilitates the formation of the organic layers 17 each having the thickness tA and the moisture-ingress barrier 17G having the thickness tB different from the thickness tA in the same process. In one embodiment where the organic layers 17 and the moisture-ingress barrier 17G are formed by ink-jetting, it is possible to stabilize the amount of ink to be discharged to form the organic layers 17 in the display region 1A. A reason is that the ink-jet discharge of the material of the organic layer 17 to form the moisture-ingress barrier 17G in the second aperture 16MB (i.e., the groove 14G) outside the display region 1A serves as a preliminary discharge before the formation of the organic layers 17 in the display region 1A. In an alternative embodiment, the organic layers 17 and the moisture-ingress barrier 17G may be formed by coating using a dispenser.

After the formation of the organic layers 17 and the moisture-ingress barrier 17G, the second electrode 18 including any of the materials described above may be formed on the organic layers 17 by sputtering, for example. Thereafter, the protection layer 19 may be deposited on the second electrode 18 by CVD, for example. Thereafter, the sealing layer 23 is formed on the protection layer 19 to hold the protection layer 19 and the second substrate 21 together. In an exemplary embodiment, the second substrate 21 may be preliminarily provided with the color filter layer 22. The manufacture of the display device 1 is thereby formed.

[Operations and Example Effects]

In the display device 1 according to any embodiment of the technology, the scanning-line driver 3 may supply a selection pulse to the switching transistor WsTr of the pixel P to select the pixel P. The signal-line driver 4 may supply, to the selected pixel P, a signal voltage in accordance with an image signal. The image signal may be thereafter held in the storage capacitor Cs. The driving transistor DsTr may be turned on/off in response to the signal held in the storage capacitor Cs. When the driving transistor DsTr is turned on, a driving current may be fed to the organic EL element 10. This may cause the organic EL element 10 (i.e., the light-emitting layer 173) to emit light through recombination of holes and electrons. The light may be extracted through the second electrode 18, the protection layer 19, the sealing layer 23, the color filter layer 22, and the second substrate 21. The pixels P (pixels pr, pg, and pb) thereby respectively emit red, green, and blue light beams, and additive color mixing of the light beams may achieve color image displaying.

In any embodiment of the technology, the moisture-ingress barrier 17G is disposed between the display region 1A and the peripheral region 1B. The moisture-ingress barrier 17G may include a material identical to the material of each organic layer 17 and have a thickness tB greater than the thickness tA of each organic layer 17. This effectively deactivates the moisture moving from the peripheral region 1B toward the display region 1A. The detail thereof is described below.

Figure 9:
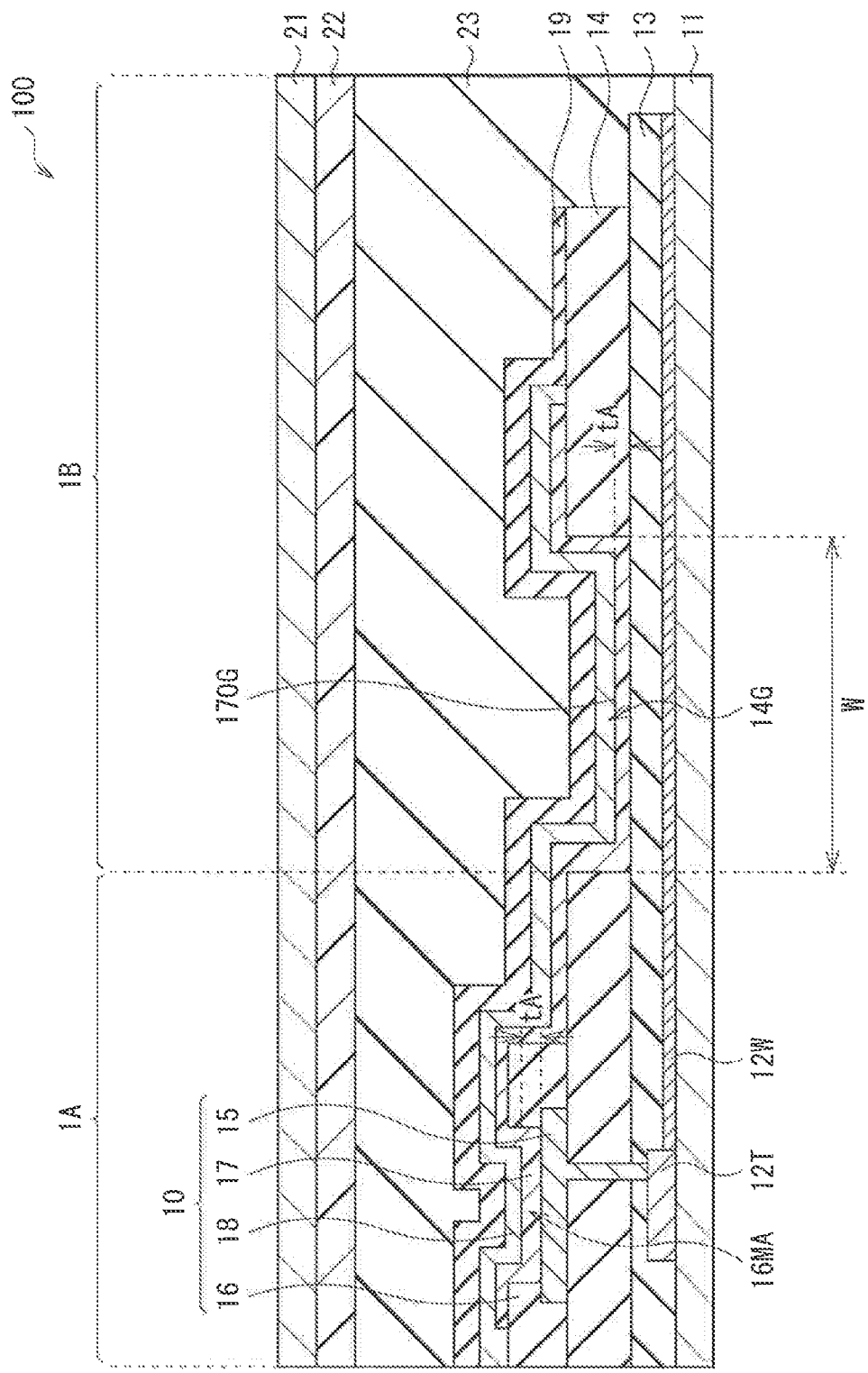
FIG. 9 is a schematic cross-sectional view of a main configuration of a display device according to a comparative example.

FIG. 9 is a schematic cross-sectional view of a main configuration of a display device 100 according to a comparative example. The display device 100 has a moisture-ingress barrier 170G in the groove 14G of the organic insulating layer 14. The moisture-ingress barrier 170G has a thickness tA equal to the thickness tA of the organic layer 17. The moisture-ingress barrier 170G is continuous with the organic layer 17. The organic layer 17 and the moisture-ingress barrier 170G may be deposited in the same process, for example. Alternatively, the moisture-ingress barrier 170G may have a thickness equal to the thickness of any layer (the electron injection layer, for example) in the organic layer 17.

It is difficult, in the display device 100, to increase the thickness tA of the moisture-ingress barrier 170G to a thickness greater than the thickness tA of the organic layer 17. The display device 100 may thus possibly fail to sufficiently deactivate the moisture moving from the peripheral region 1B. This may possibly cause degradation of the organic layer 17 in the display region 1A, resulting in defective displaying. It is conceivable to increase the width W of the groove 14G instead of increasing the thickness tA of the moisture-ingress barrier 170G, to enlarge the region in which the moisture-ingress barrier 170G is formed. In fact, this enhances efficiency in suppressing the moisture ingress from the peripheral region 1B into the display region 1A. However, the increase in the width W of the groove 14G may inevitably increase a bezel region outside the display region 1A, hindering production of the display device 100 with a narrow bezel.

In contrast, the moisture-ingress barrier 17G in the display device 1 of any embodiment of the technology has a thickness tB greater than the thickness tA of each organic layer 17. This makes it possible to efficiently deactivate the moisture moving from the peripheral region 1B, without increasing the width W of the groove 14G. In detail, the display device 1 is able to deactivate an increased amount of moisture per unit distance in the groove 14G compared with the display device 100. Accordingly, it is possible to efficiently suppress the moisture ingress from the peripheral region 1B into the display region 1A without increasing an excess bezel region.

Additionally, the organic layers 17 and the moisture-ingress barrier 17G may be formed by coating such as ink-jetting. Accordingly, it is possible to form the organic layers 17 having a thickness tA and the moisture-ingress barrier 17G having a thickness tB different from the thickness tA in the same process.

As described above, the display device 1 has the moisture-ingress barrier 17G between the display region 1A and the peripheral region 1B, and the thickness tB of the moisture-ingress barrier 17G is greater than the thickness tA of each organic layer 17. The moisture-ingress barrier 17G efficiently deactivates the moisture before the ingress of the moisture from the peripheral region 1B into the display region 1A. Accordingly, it is possible to suppress defective displaying caused by the moisture ingress into the display region 1A. It is also possible to suppress the moisture ingress without increasing the width W of the groove 14G and thus produce the display device 1 with a narrow bezel.

The organic layers 17 and the moisture-ingress barrier 17G may be formed by coating such as ink-jetting in the same process. Accordingly, it is possible to enhance efficiency in suppressing the moisture ingress without increasing the number of processes to be performed.

Further, the preliminary discharge of the ink to form the moisture-ingress barrier 17G outside the display region 1A helps to stabilize the amount of the ink to be discharged to form the organic layer 17 in the display region 1A. Accordingly, it is possible to stabilize the thickness tA of the organic layer 17 and thus maintain stable displaying quality.

Additionally, the moisture-ingress barrier 17G including the coating film with high coatability helps to suppress a short circuit between the wiring lines 12W and the second electrode 18 facing each other with the moisture-ingress barrier 17G disposed between the wiring lines 12W and the second electrode 18.

[Example Electronic Apparatuses]

The display device 1 of any embodiment of the technology may be applicable to a variety of electronic apparatuses.

Figure 10:
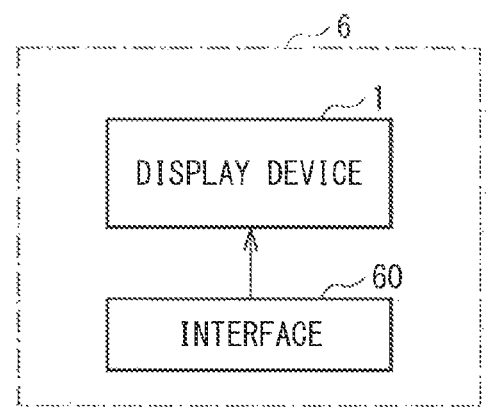
FIG. 10 is a block diagram illustrating the configuration of an electronic apparatus.

FIG. 10 is a functional block diagram of an example electronic apparatus 6. Non-limiting examples of the electronic apparatus 6 may include television sets, personal computers (PCs), smartphones, tablet PCs, mobile phones, digital still cameras, and digital video cameras.

The electronic apparatus 6 may include, for example, the display device 1 of any embodiment of the technology and an interface 60. The interface 60 may be an input unit that receives various external signals and external electric power. Optionally, the interface 60 may include, for example, a user interface such as a touch panel, a keyboard, or operation buttons.

Although the technology is described in terms of exemplary embodiments, the technology is not limited thereto. It should be appreciated that variations may be made in the embodiments described herein. For example, the material and thickness of each layer, and the method and conditions for manufacturing each layer are not limited to those described herein. Another material, thickness, manufacturing method, and manufacturing conditions may be applicable.

The organic layers 17 may each include at least the light-emitting layer 173. In an exemplary embodiment, the organic layers 17 may each include only the light-emitting layer 173. The light-emitting layers 173 may emit light in white color, for example. The light-emitting layers 173 in the pixels P may emit light in the same color.

Although the display device of any embodiment described herein is of an active-matrix type, the disclosure is also applicable to a display device of a passive-matrix type. The configuration of the pixel circuit PXLC for active-matrix driving is not limited to that described herein and may include additional capacitors and transistors as needed. Besides the scanning-line driver 3, the signal-line driver 4, and the power-line driver 5, additional driving circuits may be included depending on the alteration in the pixel circuit PXLC.

It should be appreciated that the effects described herein are mere examples. Effects of an embodiment of the disclosure are not limited to those described herein. The disclosure may further include any effect other than those described herein.

Moreover, the disclosure may have the following configurations, for example.

(1) A display device including:
a display region;
an organic insulating layer that has a groove outside the display region, and extends over the display region and a region outside the groove;
a display element that is disposed in the display region and includes, in order, a first electrode, an organic layer, and a second electrode, the organic layer including one or more moisture-reacting layers; and a moisture-ingress barrier that is disposed in the groove of the organic insulating layer, includes a material identical to a material of the one or more moisture-reacting layers, and has a thickness greater than a thickness of the one or more moisture-reacting layers.

(2) The display device according to (1), in which
the moisture-ingress barrier includes a coating film including the material identical to the material of the one or more moisture-reacting layers, and
the coating film has a thickness greater than the thickness of the one or more moisture-reacting layers.

(3) The display device according to (2), further including:
a substrate;
a thin film transistors (TFT) and a wiring line disposed on the substrate; and
an inorganic insulating layer covering the TFT and the wiring line, in which
the organic insulating layer covers the TFT and the wiring line with the inorganic insulating layer disposed between the organic insulating layer and the TFT and between the organic insulating layer and the wiring line.

(4) The display device according to (3), in which
the second electrode extends from the display region to the region outside the display region, and
the wiring line and the second electrode face each other with the moisture-ingress barrier disposed between the wiring line and the second electrode.

(5) The display device according to any one of (1) to (4), in which the one or more moisture-reacting layers in the display region are disposed separately from the moisture-ingress barrier.

(6) The display device according to any one of (1) to (5), further including:
an element isolation film that is disposed on the first electrode and has a first aperture exposing the first electrode, in which
the organic layer is disposed on the first aperture of the element isolation film.

(7) The display device according to (6), in which
the element isolation film is provided in the display region and the region outside the display region and has a second aperture exposing the groove of the organic insulating layer.

(8) The display device according to any one of (1) to (7), in which
the organic layer includes a hole injection layer, a hole transport layer, a light-emitting layer, an electron transport layer, and an electron injection layer, and
the one or more moisture-reacting layers are one or more of the hole injection layer, the hole transport layer, the light-emitting layer, the electron transport layer, and the electron injection layer.

(9) The display device according to any one of (1) to (8), in which the moisture-ingress barrier includes the material of the organic layer.

(10) The display device according to (9), in which the thickness of the moisture-ingress barrier is greater than the thickness of the organic layers.

(11) A method of manufacturing a display device, the method including:
forming an organic insulating layer that has a groove outside a display region and extends over the display region and a region outside the groove;
forming a first electrode in the display region;
forming an organic layer on the first electrode, and a moisture-ingress barrier in the groove of the organic insulating layer, the organic layer including one or more moisture-reacting layers, the moisture-ingress barrier including a material identical to the material of the one or more moisture-reacting layers and having a thickness greater than the thickness of the one or more moisture-reacting layers; and
forming a second electrode on the organic layer to form a display element including the first electrode, the organic layer, and the second electrode.

(12) The method according to (11), in which
the forming the organic layer comprises coating, and
the one or more moisture-reacting layers and the moisture-ingress barrier are formed in the same process.

According to the display device of any embodiment of the technology, the moisture-ingress barrier is disposed in the groove of the organic insulating layer. The moisture-ingress barrier includes a material identical to the material of the one or more moisture-reacting layers in the display region and has a thickness greater than the thickness of the one or more moisture-reacting layers. This moisture-ingress barrier efficiently deactivates the moisture.

According to the method of manufacturing the display device of any embodiment of the technology, the moisture-ingress barrier is formed in the groove of the organic insulating layer. The moisture-ingress barrier includes a material identical to the material of the one or more moisture-reacting layers in the display region and has a thickness greater than the thickness of the one or more moisture-reacting layers. This moisture-ingress barrier efficiently deactivates the moisture.

According to the display device and the method of manufacturing the display device of one embodiment of the technology, the moisture-ingress barrier disposed outside the display region is able to deactivate the moisture before the ingress of external moisture into the display region. Accordingly, it is possible to suppress the moisture ingress into the display region.

It should be appreciated that the effects of the technology are not limited to those described hereinabove. The effects of the technology may include any effect described herein.

Although the disclosure has been described in terms of exemplary embodiments, it is not limited thereto. It should be appreciated that variations may be made in the described embodiments by persons skilled in the art without departing from the scope of the disclosure as defined by the following claims. The limitations in the claims are to be interpreted broadly based on the language employed in the claims and not limited to examples described in this specification or during the prosecution of the application, and the examples are to be construed as non-exclusive. For example, in this disclosure, the use of the terms first, second, etc. do not denote any order or importance, but rather the terms first, second, etc. are used to distinguish one element from another. Moreover, no element or component in this disclosure is intended to be dedicated to the public regardless of whether the element or component is explicitly recited in the following claims.

What is claimed is:

1. A display device comprising:
    a display region;
    an organic insulating layer that has a groove outside the display region, and extends over the display region and a region outside the groove;
    a display element that is disposed in the display region and includes, in order, a first electrode, an organic layer, and a second electrode, the organic layer including one or more moisture-reacting layers; and
    a moisture-ingress barrier that is disposed in the groove of the organic insulating layer, includes a material identical to a material of the one or more moisture-reacting layers, and has a thickness greater than a thickness of the one or more moisture-reacting layers, wherein an entirety of the second electrode is outside of the groove.

2. The display device according to claim 1, wherein
    the moisture-ingress barrier comprises a coating film including the material identical to the material of the one or more moisture-reacting layers, and
    the coating film has a thickness greater than the thickness of the one or more moisture-reacting layers.

3. The display device according to claim 2, further comprising:
    a substrate;
    a thin film transistor and a wiring line disposed on the substrate; and
    an inorganic insulating layer covering the thin film transistor and the wiring line, wherein
    the organic insulating layer covers the thin film transistor and the wiring line with the inorganic insulating layer disposed between the organic insulating layer and the thin film transistor and between the organic insulating layer and the wiring line.

4. The display device according to claim 3, wherein
    the second electrode extends from the display region to the region outside the display region, and
    the wiring line and the second electrode face each other with the moisture-ingress barrier disposed between the wiring line and the second electrode.

5. The display device according to claim 1, wherein the one or more moisture-reacting layers in the display region are disposed separately from the moisture-ingress barrier.

6. The display device according to claim 1, further comprising:
    an element isolation film that is disposed on the first electrode and has a first aperture exposing the first electrode, wherein
    the organic layer is disposed on the first aperture of the element isolation film.

7. The display device according to claim 6, wherein
    the element isolation film is provided in the display region and the region outside the display region and has a second aperture exposing the groove of the organic insulating layer.

8. The display device according to claim 1, wherein
    the organic layer includes a hole injection layer, a hole transport layer, a light-emitting layer, an electron transport layer, and an electron injection layer, and
    the one or more moisture-reacting layers comprises one or more of the hole injection layer, the hole transport layer, the light-emitting layer, the electron transport layer, and the electron injection layer.

9. The display device according to claim 1, wherein the moisture-ingress barrier includes the material of the organic layer.

10. The display device according to claim 9, wherein the thickness of the moisture-ingress barrier is greater than a thickness of the organic layer.

11. The display device according to claim 1, wherein the one or more moisture-reacting layers in the display region are discontinuous with respect to the moisture-ingress barrier.

12. The display device according to claim 1, wherein the moisture-ingress barrier completely fills the groove.

13. A method of manufacturing a display device, the method comprising:
    forming an organic insulating layer that has a groove outside a display region and extends over the display region and a region outside the groove;
    forming a first electrode in the display region;
    forming an organic layer on the first electrode, and a moisture-ingress barrier in the groove of the organic insulating layer, the organic layer including one or more moisture-reacting layers, the moisture-ingress barrier including a material identical to a material of the one or more moisture-reacting layers and having a thickness greater than a thickness of the one or more moisture-reacting layers; and
    forming a second electrode on the organic layer to form a display element including the first electrode, the organic layer, and the second electrode, wherein the forming of the second electrode comprises forming the second electrode completely outside the groove.

14. The method of claim 13, wherein the forming of the moisture-ingress barrier comprises forming the moisture-ingress barrier having a thickness greater than an entirety of the organic layer.

15. The method according to claim 13, wherein the forming of the moisture-ingress barrier comprises filling an entirety of the groove.

16. The method according to claim 13, wherein
   the forming the organic layer comprises coating, and
   the one or more moisture-reacting layers and the moisture-ingress barrier are formed in a same process.

17. A display device comprising:
   a display region;
   a display element in the display region, wherein the display element comprises:
      a first electrode,
      an organic layer, wherein the organic layer comprises a moisture-reacting layer, and
      a second electrode
   an organic insulating layer over the display region and a peripheral region, wherein the organic insulating layer defines a groove in the peripheral region;
   a moisture-ingress barrier completely filling the groove, wherein a material of the moisture-ingress barrier is identical to a material of the moisture-reacting layer.

* * * * *